United States Patent
Namie et al.

(10) Patent No.: US 10,825,785 B2
(45) Date of Patent: Nov. 3, 2020

(54) SEMICONDUCTOR DEVICE

(71) Applicant: Murata Manufacturing Co., Ltd., Kyoto (JP)

(72) Inventors: Hisanori Namie, Kyoto (JP); Satoshi Goto, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/157,469

(22) Filed: Oct. 11, 2018

(65) Prior Publication Data

US 2019/0123003 A1  Apr. 25, 2019

(30) Foreign Application Priority Data

Oct. 23, 2017  (JP) ................... 2017-204492

(51) Int. Cl.
| | |
|---|---|
| H03F 3/191 | (2006.01) |
| H01L 23/66 | (2006.01) |
| H01L 23/00 | (2006.01) |
| H03F 3/195 | (2006.01) |
| H03F 1/56 | (2006.01) |

(Continued)

(52) U.S. Cl.
CPC ............. *H01L 23/66* (2013.01); *H01L 24/06* (2013.01); *H01L 24/13* (2013.01); *H01L 24/14* (2013.01); *H01L 24/17* (2013.01); *H01L 27/0647* (2013.01); *H01L 29/735* (2013.01); *H03F 1/565* (2013.01); *H03F 3/195* (2013.01); *H03F 3/213* (2013.01); *H01L 29/73* (2013.01); *H01L 2223/6611* (2013.01); *H01L 2223/6655* (2013.01); *H01L 2224/13014* (2013.01); *H01L 2224/1403* (2013.01); *H01L 2224/1415* (2013.01); *H01L 2224/14051* (2013.01); *H01L 2224/16225* (2013.01); *H01L 2224/451* (2013.01); *H01L 2224/48227* (2013.01); *H01L 2924/00014* (2013.01); *H01L 2924/1205* (2013.01); *H01L 2924/1206* (2013.01); *H01L 2924/1304* (2013.01); *H01L 2924/13051* (2013.01); *H01L 2924/13091* (2013.01); *H01L 2924/30111* (2013.01); *H03F 2200/267* (2013.01); *H03F 2200/387* (2013.01); *H03F 2200/451* (2013.01)

(58) Field of Classification Search
CPC ........................................................ H03F 3/191
USPC .................................................. 330/302, 305
See application file for complete search history.

(56) References Cited

U.S. PATENT DOCUMENTS

| | | |
|---|---|---|
| 8,983,406 B2 | 3/2015 | Zhang et al. |
| 9,391,567 B2 * | 7/2016 | Kaczman ................ H03F 1/565 |

(Continued)

*Primary Examiner* — Henry Choe
(74) *Attorney, Agent, or Firm* — Pearne & Gordon LLP

(57) ABSTRACT

A semiconductor device includes a semiconductor substrate, a transistor, and a first harmonic termination circuit. The transistor is formed at the semiconductor substrate. The transistor amplifies an input signal supplied to an input end and outputs an amplified signal through an output end. The first harmonic termination circuit attenuates a harmonic component included in the amplified signal. The first harmonic termination circuit is formed at the semiconductor substrate such that one end of the first harmonic termination circuit is connected to the output end of the transistor and the other end of the first harmonic termination circuit is connected to a ground end of the transistor.

8 Claims, 5 Drawing Sheets

(51) Int. Cl.
    *H03F 3/213*     (2006.01)
    *H01L 27/06*     (2006.01)
    *H01L 29/735*     (2006.01)
    *H01L 29/73*     (2006.01)

(56) References Cited

U.S. PATENT DOCUMENTS

| | | |
|---|---|---|
| 9,467,940 B2 | 10/2016 | Zhang et al. |
| 9,503,025 B2 | 11/2016 | Cao et al. |
| 9,847,755 B2 | 12/2017 | Sun et al. |
| 10,027,291 B2 * | 7/2018 | Goto ............... H03F 3/245 |
| 2016/0285499 A1 | 9/2016 | Kaczman |
| 2016/0294333 A1 | 10/2016 | Feng et al. |
| 2016/0380603 A1 | 12/2016 | Zhang et al. |
| 2017/0288616 A1 * | 10/2017 | Goto ............... H03F 1/565 |

* cited by examiner

SEMICONDUCTOR DEVICE

This application claims priority from Japanese Patent Application No. 2017-204492 filed on Oct. 23, 2017. The content of this application is incorporated herein by reference in its entirety.

BACKGROUND

The present disclosure relates to semiconductor devices. In potable terminals using a communication network for cellular phones, a power amplifier module for amplifying electric power of a radio frequency (RF) signal to be transmitted to a base station is used. In such power amplifier modules, a harmonic termination circuit is used to attenuate a harmonic component of an amplified signal output from an amplifier (a signal having a frequency that is integral multiple of a fundamental frequency of an amplified signal). For example, in U.S. Pat. No. 8,983,406, a power amplifier module in which a harmonic termination circuit of an output matching circuit is configured to be provided at a pad different from that for fundamental wave output is disclosed.

However, it has been newly found by the inventors that with a configuration in which a harmonic termination circuit is grounded at a module substrate on which a semiconductor substrate is mounted, characteristics of a power amplifier module are deteriorated by the harmonic termination circuit. That is, in the case of wire-bonding mounting, variations in harmonic termination characteristics are caused by variations in the shape of bond wires. Furthermore, in the case of flip-chip mounting, harmonic termination characteristics are deteriorated by loss in output at a bump. Furthermore, in the case where an outer electrode for external connection is provided at the harmonic termination circuit, an electrostatic discharge (ESD) protection element to protect the harmonic termination circuit is required. The voltage amplitude at output of an amplifier is large, and therefore, it is difficult to add the ESD protection element while the output being maintained at a certain level.

BRIEF SUMMARY

Accordingly, the present disclosure provides a semiconductor device in which deterioration in characteristics by a harmonic termination circuit is reduced.

According to embodiments of the present disclosure, a semiconductor device includes a semiconductor substrate; a transistor that amplifies an input signal supplied to an input end and outputs an amplified signal through an output end, the transistor being formed at the semiconductor substrate; and a first harmonic termination circuit to attenuate a harmonic component included in the amplified signal, the first harmonic termination circuit being formed at the semiconductor substrate such that one end of the first harmonic termination circuit is connected to the output end of the transistor and the other end of the first harmonic termination circuit is connected to a ground end of the transistor.

According to the present disclosure, a semiconductor device in which deterioration in characteristics by a harmonic termination circuit is reduced can be provided.

Other features, elements, characteristics and advantages of the present disclosure will become more apparent from the following detailed description of embodiments of the present disclosure with reference to the attached drawings.

DETAILED DESCRIPTION

Figure 1:
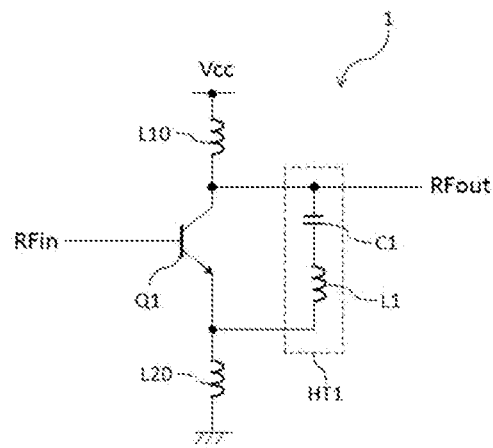
FIG. 1 is a circuit diagram of a power amplifier circuit mounted on a semiconductor device according to a first embodiment of the present disclosure.

Embodiments of the present disclosure will be explained with reference to accompanying drawings. In the drawings, components referred to with the same reference signs have the same or similar configurations.

First Embodiment

FIG. 1 is a circuit diagram of a power amplifier circuit mounted on a semiconductor device according to a first embodiment of the present disclosure. A power amplifier circuit 1 illustrated in FIG. 1 is a circuit that amplifies an input signal, which is an RF signal, and outputs an amplified signal. For example, the frequency of an input signal ranges from about several hundred MHz to about several GHz.

The power amplifier circuit 1 includes, for example, a transistor Q1, a harmonic termination circuit HT1, an inductor L10, and a parasitic inductor L20.

The transistor Q1 configures a power amplifier that amplifies an RF signal. In the first embodiment, the transistor Q1 is a bipolar transistor such as a heterojunction bipolar transistor (HBT) or the like. The transistor may be a different type of transistor such as a metal-oxide-semiconductor field-effect transistor (MOSFET) or the like.

An input signal RFin is supplied to a base (input end) of the transistor Q1. A power supply voltage Vcc is supplied to a collector (output end) of the transistor Q1 via the inductor L10. An emitter (ground end) of the transistor Q1 is connected to the ground via the parasitic inductor L20. The transistor Q1 amplifies the input signal RFin and outputs an amplified signal RFout through the collector. Although not illustrated in FIG. 1, a bias current or voltage is supplied from a bias circuit to the base of the transistor Q1. The number of transistors Q1 included in the power amplifier circuit 1 is not limited to one. A plurality of transistors Q1 may be included in the power amplifier circuit 1.

The inductor L10 is a choke inductor that reduces leakage of an RF signal toward a power supply. For explanation, the inductor L10 is represented by a symbol indicating an inductance element. However, the inductor L10 is not necessarily an inductance element. The inductor L10 may be a different element containing an inductance component. A different element containing an inductance component is, for example, a bond wire formed by wire bonding or the like.

The parasitic inductor L20 is an element containing an inductance component and is, for example, a parasitic inductance of a semiconductor substrate at which the transistor Q1 is formed and a parasitic inductance such as a wire formed at a module substrate for mounting the semiconductor substrate.

The harmonic termination circuit HT1 is a circuit that attenuates a harmonic component contained in the amplified signal RFout output from the collector of the transistor Q1. Specifically, the harmonic termination circuit HT1 is a series resonance circuit including a capacitor C1 and an inductor L1 that are connected in series.

One end of the capacitor C1 is connected to the collector of the transistor Q1, and the other end of the capacitor C1 is connected to one end of the inductor L1. The other end of the inductor L1 is connected to the emitter of the transistor Q1. The inductor L1 is an element containing an inductance component and is, for example, a wire formed inside the semiconductor substrate at which the transistor Q1 is formed. The number of harmonic termination circuits is not limited to one. Another harmonic termination circuit may be provided in parallel to the harmonic termination circuit HT1.

Figure 2:
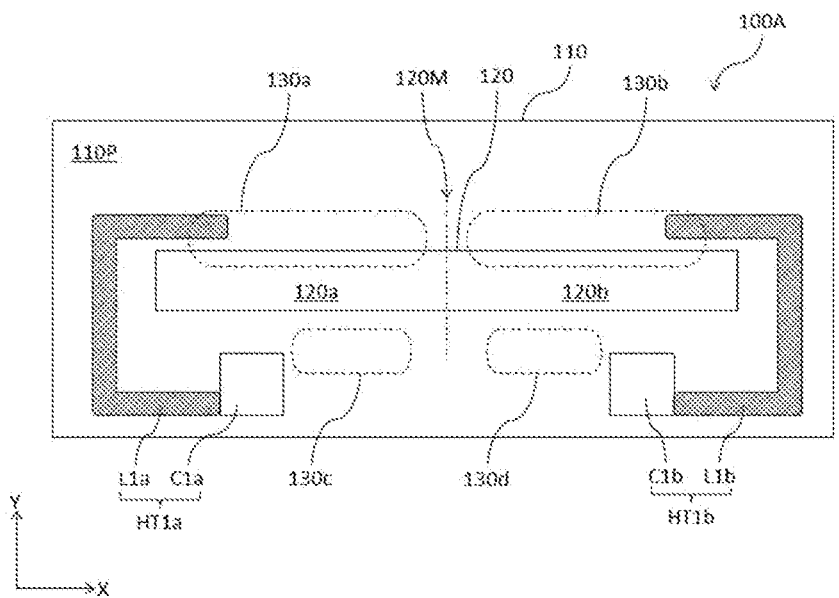
FIG. 2 is a schematic plan view of a semiconductor device according to the first embodiment of the present disclosure.

FIG. 2 is a schematic plan view of a semiconductor device 100A according to the first embodiment of the present disclosure.

The semiconductor device 100A includes, for example, a semiconductor substrate 110, a transistor region 120, a harmonic termination circuit HT1a (first harmonic termination circuit), and a harmonic termination circuit HT1b (second harmonic termination circuit).

The semiconductor substrate 110 is a semiconductor substrate that includes a main surface 110P having substantially a rectangular shape that is parallel to an XY plane on which various elements are to be mounted. The semiconductor substrate 110 is mounted on a module substrate, which is not illustrated in FIG. 2, with bumps 130a, 130b, 130c, 130d, and the like interposed therebetween by so-called flip-chip mounting.

The transistor region 120 is a region in which the transistor Q1 is formed. In the first embodiment, the transistor Q1 is a multi-finger transistor including a plurality of fingers (unit transistors) that are connected in parallel to each other. The plurality of fingers of the transistor Q1 formed in the transistor region 120 are arranged symmetrically with respect to a median line 120M that is parallel to a Y axis. The transistor region 120 includes a first transistor region 120a that is located in an X-axis negative direction relative to the median line 120M and a second transistor region 120b that is located in an X-axis positive direction relative to the median line 120M.

The emitter of the transistor Q1 formed in the first transistor region 120a is electrically connected to the bump 130a. The emitter of the transistor Q1 formed in the second transistor region 120b is electrically connected to the bump 130b. To mount the semiconductor substrate 110 on the module substrate, the bumps 130a and 130b are electrically connected to ground electrodes formed at the module substrate. Accordingly, the emitter of each of the transistors Q1 is connected to the ground.

The collector of the transistor Q1 formed in the first transistor region 120a is electrically connected to the bump 130c. The collector of the transistor Q1 formed in the second transistor region 120b is electrically connected to the bump 130d. To mount the semiconductor substrate 110 on the module substrate, the bumps 130c and 130d are electrically connected to wires formed at the module substrate.

The harmonic termination circuit HT1a is a circuit that attenuates a harmonic component contained in an amplified signal output from the collector of the transistor Q1 formed in the first transistor region 120a, as explained above with reference to FIG. 1. Specifically, the harmonic termination circuit HT1a is a series resonance circuit that includes a capacitor C1a (first capacitor) and an inductor L1a (first inductor) that are connected in series. The inductor L1a is, for example, a wire containing an inductance component provided at the semiconductor substrate 110.

One end of the harmonic termination circuit HT1a is connected to the output end of the transistor Q1 formed in the first transistor region 120a on the semiconductor substrate 110. Furthermore, the other end of the harmonic termination circuit HT1a is connected to the ground end of the transistor Q1 formed in the first transistor region 120a on the semiconductor substrate 110. Specifically, one end of the capacitor C1a is connected to the collector of the transistor Q1 formed in the first transistor region 120a, and the other end of the capacitor C1a is connected to one end of the inductor L1a. The other end of the inductor L1a is connected to the bump 130a, which is electrically connected to the ground electrode at the module substrate, as described above.

In a similar manner, the harmonic termination circuit HT1b is a circuit that attenuates a harmonic component contained in an amplified signal output from the collector of the transistor Q1 formed in the second transistor region 120b, as described above with reference to FIG. 1. Specifically, the harmonic termination circuit HT1b is a series resonance circuit that includes a capacitor C1b (second capacitor) and an inductor L1b (second inductor) that are connected in series. The inductor L1b is, for example, a wire containing an inductance component provided at the semiconductor substrate 110.

One end of the harmonic termination circuit HT1b is connected to the output end of the transistor Q1 formed in the second transistor region 120b on the semiconductor substrate 110. Furthermore, the other end of the harmonic termination circuit HT1b is connected to the ground end of the transistor Q1 formed in the second transistor region 120b on the semiconductor substrate 110. Specifically, one end of the capacitor C1b is connected to the collector of the transistor Q1 formed in the second transistor region 120b, and the other end of the capacitor C1b is connected to one end of the inductor L1b. The other end of the inductor L1b is connected to the bump 130b, which is electrically connected to the ground electrode at the module substrate, as described above.

The harmonic termination circuit HT1a and the harmonic termination circuit HT1b are arranged symmetrically with respect to the median line 120M described above. In other words, the harmonic termination circuit HT1a and the harmonic termination circuit HT1b are arranged symmetrically with respect to the transistor region 120. Specifically, the capacitor C1a and the capacitor C1b are arranged symmetrically with respect to the median line 120M (transistor region 120), and the inductor L1a and the inductor L1b are arranged symmetrically with respect to the median line 120M (transistor region 120).

Figure 3:
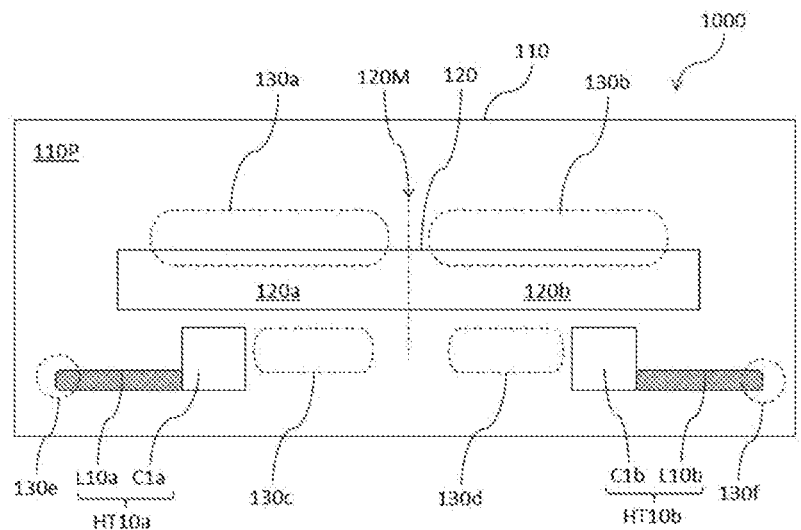
FIG. 3 is a schematic plan view of a semiconductor device according to a comparative example.

FIG. 3 is a schematic plan view of a semiconductor device 1000 according to a comparative example. Configuration features of the semiconductor device 1000 according to the comparative example that are different from those of the semiconductor device 100A according to the first embodiment of the present disclosure will be explained below. Explanation for the same configuration features as those of the semiconductor device 100A will be omitted in an appropriate manner.

The semiconductor device 1000 further includes bumps 130e and 130f, in addition to the bumps 130a, 130b, 130c, and 130d. To mount the semiconductor substrate 110 on the module substrate, the bumps 130e and 130f are electrically connected to ground electrodes formed at the module substrate.

The semiconductor device 1000 includes harmonic termination circuits HT10a and HT10b. The harmonic termination circuit HT10a is a series resonance circuit that includes the capacitor C1a and an inductor L10a that are connected in series. The harmonic termination circuit HT10b is a series resonance circuit that includes the capacitor C1b and an inductor L10b that are connected in series.

One end of the harmonic termination circuit HT10a is connected to the output end of the transistor Q1 formed in the first transistor region 120a. However, the other end of the harmonic termination circuit HT10a is not connected to the ground end of the transistor Q1 formed in the first transistor region 120a but is connected to the ground electrode at the module substrate with the bump 130e interposed therebetween. Specifically, one end of the capacitor C1a is connected to the collector of the transistor Q1 formed in the first transistor region 120a, and the other end of the capacitor C1a is connected to one end of the inductor L10a. The other end of the inductor L10a is connected to the bump 130e, which is electrically connected to the ground electrode at the module substrate, as described above.

In a similar manner, one end of the harmonic termination circuit HT10b is connected to the output end of the transistor Q1 formed in the second transistor region 120b. However, the other end of the harmonic termination circuit HT10b is not connected to the ground end of the transistor Q1 formed in the second transistor region 120b but is connected to the ground electrode at the module substrate with the bump 130f interposed therebetween. Specifically, one end of the capacitor C1b is connected to the collector of the transistor Q1 formed in the second transistor region 120b, and the other end of the capacitor C1b is connected to one end of the inductor L10b. The other end of the inductor L10b is connected to the bump 130f, which is electrically connected to the ground electrode at the module substrate, as described above.

Figure 4:
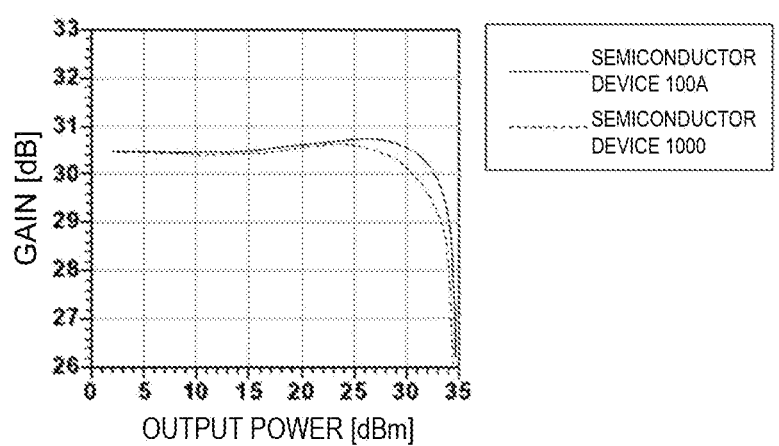
FIG. 4 is a graph illustrating results of simulation of a gain.

FIG. 4 is a diagram illustrating results of simulation of a gain. In FIG. 4, the horizontal axis represents an output level (dBm) of an RF signal, and the vertical axis represents a gain (dB). In FIG. 4, a solid line represents results of simulation of a gain of the semiconductor device 100A according to the first embodiment of the present disclosure, and a broken line represents results of simulation of a gain of the semiconductor device 1000 according to the comparative example. In each of the semiconductor device 100A and the semiconductor device 1000, the frequency of an RF signal is about 3,500 MHz.

As is clear from FIG. 4, the linearity of the gain of the semiconductor device 100A is excellent compared to that of the semiconductor device 1000 according to the comparative example. In particular, the gain of the semiconductor device 1000 significantly drops at a relatively early stage when the output level increases. In contrast, a significant change does not occur in the gain of the semiconductor device 100A up to about 30 dBm, and it is thus clear that linearity of the semiconductor device 100A is maintained.

Figure 5:
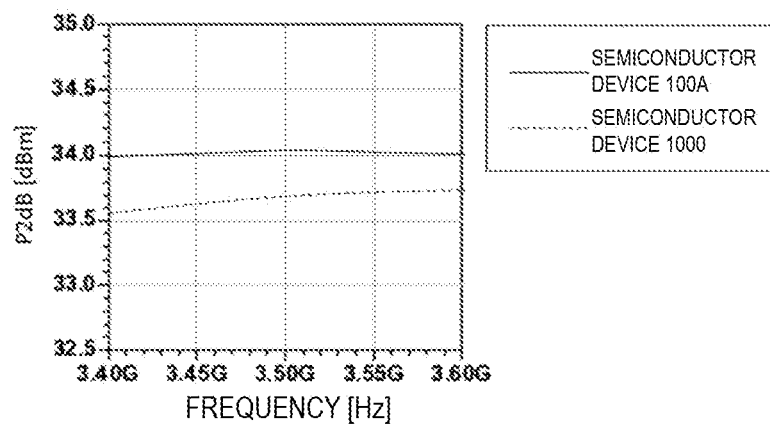
FIG. 5 is a graph illustrating results of simulation of P2dB.

FIG. 5 is a diagram illustrating results of simulation of P2dB. Herein, P2dB represents an output level at a point to which ideal linear output characteristics are decreased by about 2 dB. In FIG. 5, the horizontal axis represents a frequency (Hz) of an RF signal, and the vertical axis represents P2dB (dBm). In FIG. 5, a solid line represents results of simulation of P2dB of the semiconductor device 100A according to the first embodiment of the present disclosure, and a broken line represents results of simulation of P2dB of the semiconductor device 1000 according the comparative example.

As is clear from FIG. 5, P2dB of the semiconductor device 100A in a frequency band from about 3.40 GHz to about 3.60 GHz is improved, compared to the semiconductor device 1000.

Figure 6:
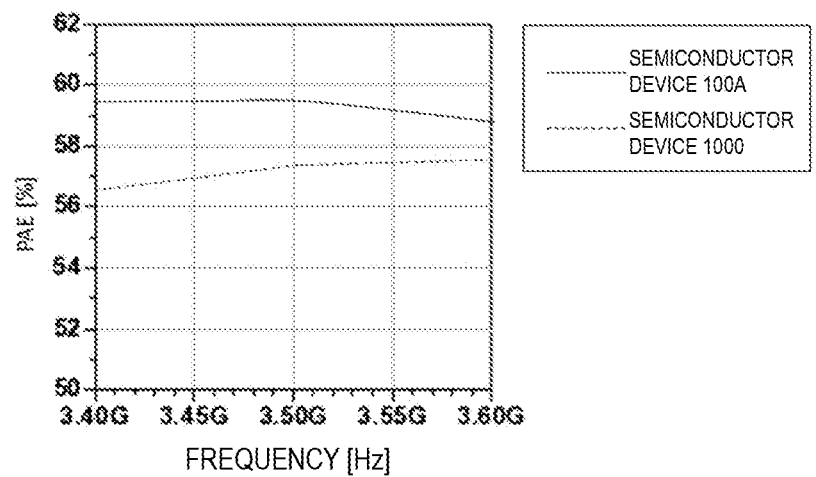
FIG. 6 is a graph illustrating results of simulation of power-added efficiency (PAE)

FIG. 6 is a diagram illustrating results of simulation of a power-added efficiency (PAE). In FIG. 6, the horizontal axis represents a frequency (Hz) of an RF signal, and the vertical axis represents a PAE (%). In FIG. 6, a solid line represents results of simulation of the PAE of the semiconductor device 100A according to the first embodiment of the present disclosure, and a broken line represents results of simulation of the PAE of the semiconductor device 1000 according to the comparative example.

As is clear from FIG. 6, the PAE of the semiconductor device 100A in a frequency band from about 3.40 GHz to about 3.60 GHz is improved, compared to the semiconductor device 1000.

As described above, in the semiconductor device 100A, one ends of the harmonic termination circuits HT1a and HT1b are connected to the output ends of the transistors Q1, and the other ends of the harmonic termination circuits HT1a and HT1b are connected to the ground ends of the transistors Q1. Thus, in the semiconductor device 100A, the other ends of the harmonic termination circuits HT1a and HT1b are connected to the bumps 130a and 130b, which are connected to the ground ends of the transistors, and therefore, parasitic resistance components of the bumps 130a and 130b are smaller than parasitic resistances of the bumps 130e and 130f. Consequently, loss in the output of the semiconductor device 100A can be reduced. Furthermore, in the semiconductor device 100A, each harmonic termination circuit is closed within a chip, and therefore, no external electrode is needed. Consequently, there is no need to add an ESD protection element to protect the harmonic termination circuit.

Furthermore, the semiconductor device 100A includes the plurality of harmonic termination circuits HT1a and HT1b. Therefore, in the semiconductor device 100A, variations in the length of wires for connecting the collectors of the transistors Q1 formed in the transistor region 120 and the harmonic termination circuits are reduced.

Furthermore, the harmonic termination circuit HT1a and the harmonic termination circuit HT1b of the semiconductor device 100A are arranged symmetrically with respect to the transistor region 120. Therefore, in the semiconductor device 100A, variations in the length of wires for connecting the collectors of the transistors Q1 formed in the transistor region 120 and the harmonic termination circuits are reduced.

Modification of First Embodiment

Figure 7:
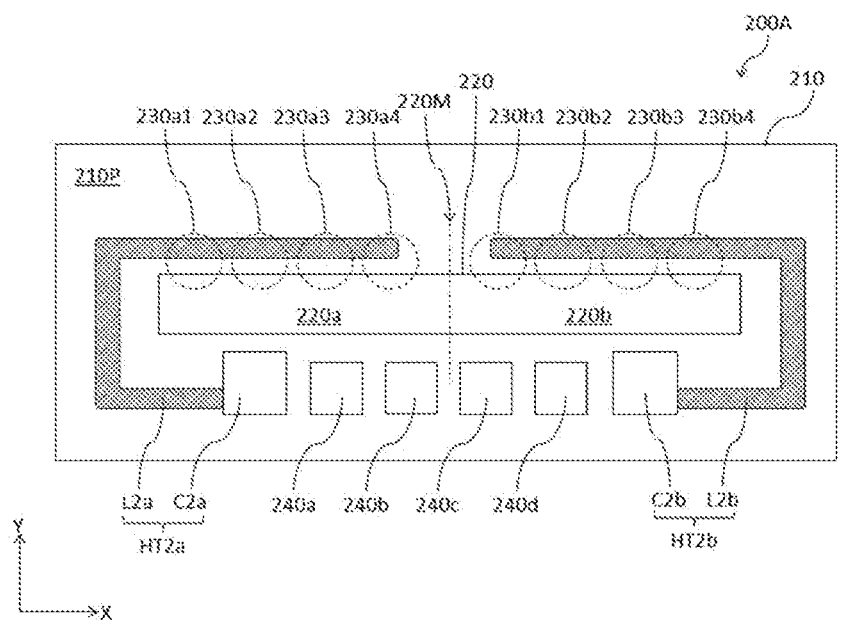
FIG. 7 is a schematic plan view of a semiconductor device according to a modification of the first embodiment of the present disclosure.

FIG. 7 is a schematic plan view of a semiconductor device 200A according to a modification of the first embodiment of the present disclosure.

The semiconductor device 200A includes, for example, a semiconductor substrate 210, a transistor region 220, and harmonic termination circuits HT2a and HT2b.

The semiconductor substrate 210 is a semiconductor substrate that includes a main surface 210P having substantially a rectangular shape that is parallel to an XY plane on which various elements are to be mounted. A terminal provided at the semiconductor substrate 210 is connected with a terminal provided at a module substrate, which is not illustrated in FIG. 7, by a metal wire, by so-called wire-bonding mounting, so that the semiconductor substrate 210 is mounted on the module substrate.

The transistor region 220 is a region in which the transistor Q1 is formed. In the first embodiment, the transistor Q1 is a multi-finger transistor including a plurality of fingers (unit transistors) that are connected in parallel to each other. The plurality of fingers of the transistor Q1 formed in the transistor region 220 are arranged symmetrically with respect to a median line 220M that is parallel to a Y axis. The transistor region 220 includes a first transistor region 220a that is located in an X-axis negative direction relative to the median line 220M and a second transistor region 220b that is located in an X-axis positive direction relative to the median line 220M.

In the semiconductor substrate 210, vias 230a1, 230a2, 230a3, 230a4, 230b1, 230b2, 230b3, and 230b4 are formed. Emitters of the transistor Q1 formed in the first transistor region 220a are electrically connected to the vias 230a1, 230a2, 230a3, and 230a4. Furthermore, emitters of the transistor Q1 formed in the second transistor region 220b are electrically connected to the vias 230b1, 230b2, 230b3, and 230b4. The vias 230a1, 230a2, 230a3, 230a4, 230b1, 230b2, 230b3, and 230b4 are connected to emitter terminals, which are not illustrated in FIG. 7, provided at the semiconductor substrate 210. To mount the semiconductor substrate 210 on the module substrate, the emitter terminals are electrically connected to ground electrodes formed at the module substrate. Accordingly, the emitters of the transistors Q1 are connected to the ground. Vias may be formed on the median line 220M.

At the semiconductor substrate 210, collector terminals 240a, 240b, 240c, and 240d are formed. Collectors of the transistor Q1 formed in the first transistor region 220a are electrically connected to the collector terminals 240a and 240b. Collectors of the transistor Q1 formed in the second transistor region 220b are electrically connected to the collector terminals 240c and 240d. To mount the semiconductor substrate 210 on the module substrate, the collector terminals 240a, 240b, 240c, and 240d are electrically connected to wires formed at the module substrate.

As explained above with reference to FIG. 1, the harmonic termination circuit HT2a is a circuit that attenuates a harmonic component contained in an amplified signal output from the collector of the transistor Q1 formed in the first transistor region 220a. Specifically, the harmonic termination circuit HT2a is a series resonance circuit that includes a capacitor C2a and an inductor L2a that are connected in series. The inductor L2a is a wire that contains an inductance component provided at the semiconductor substrate 210.

One end of the harmonic termination circuit HT2a is connected to the output end of the transistor Q1 formed in the first transistor region 220a, and the other end of the harmonic termination circuit HT2a is connected to the emitters of the transistor Q1 formed in the first transistor region 220a and the vias 230a1 to 230a4. Specifically, one end of the capacitor C2a is connected to the collectors of the transistor Q1 formed in the first transistor region 220a, and the other end of the capacitor C2a is connected to one end of the inductor L2a. The other end of the inductor L2a is connected to the vias 230a1, 230a2, 230a3, and 230a4, which are connected to the emitter terminals, which are not illustrated in FIG. 7, provided at the semiconductor substrate 210, as described above.

In a similar manner, the harmonic termination circuit HT2b is a circuit that attenuates a harmonic component contained in an amplified signal output from the collector of the transistor Q1 formed in the second transistor region 220b, as explained above with reference to FIG. 1. Specifically, the harmonic termination circuit HT2b is a series resonance circuit that includes a capacitor C2b and an inductor L2b that are connected in series. The inductor L2b is a wire that contains an inductance component provided at the semiconductor substrate 210.

One end of the harmonic termination circuit HT2b is connected to the output end of the transistor Q1 formed in the second transistor region 220b, and the other end of the harmonic termination circuit HT2b is connected to the emitters of the transistor Q1 formed in the second transistor region 220b and the vias 230b1 to 230b4. Specifically, one end of the capacitor C2b is connected to the collectors of the transistor Q1 formed in the second transistor region 220b, and the other end of the capacitor C2b is connected to one end of the inductor L2b. The other end of the inductor L2b is connected to the vias 230b1, 230b2, 230b3, and 230b4, which are connected to the emitter terminals, which are not illustrated in FIG. 7, provided at the semiconductor substrate 210, as described above.

As described above, in the semiconductor device 200A, one ends of the harmonic termination circuits HT2a and HT2b are connected to the output ends of the transistors Q1, and the other ends of the harmonic termination circuits HT2a and HT2b are connected to the ground ends of the transistors Q1. Therefore, there is no need to connect the harmonic termination circuits to the module substrate by bond wires or the like, and deterioration in characteristics caused by variations in the shape of bond wires is reduced.

Second Embodiment

Figure 8:
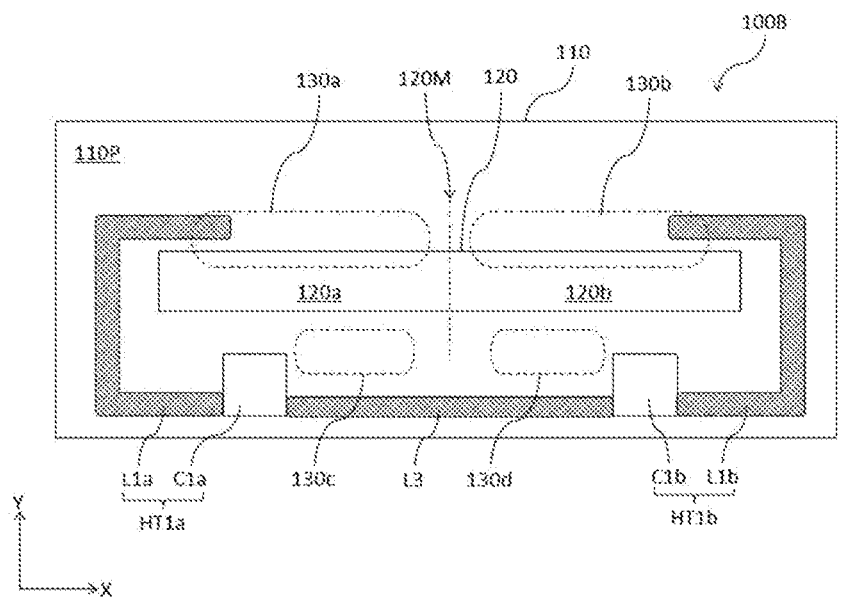
FIG. 8 is a schematic plan view of a semiconductor device according to a second embodiment of the present disclosure.

FIG. 8 is a schematic plan view of a semiconductor device 100B according to a second embodiment of the present disclosure. Configuration features of the semiconductor device 100B according to the second embodiment of the present disclosure that are different from those of the semiconductor device 100A according to the first embodiment of the present disclosure will be explained below. Explanation for configuration features of the semiconductor device 100B that are the same as those of the semiconductor device 100A will be omitted in an appropriate manner.

The semiconductor device 100B further includes an inductor L3 (third inductor). The inductor L3 is formed at the semiconductor substrate 110 such that a portion between the capacitor C1a and the inductor L1a that are included in the harmonic termination circuit HT1a is connected with a portion between the capacitor C1b and the inductor L1b that are included in the harmonic termination circuit HT1b. The inductor L3 is, for example, a wire that contains an inductance component provided at the semiconductor substrate 110.

With the above configuration of the semiconductor device 100B, even if variations occur in the length of lines of the inductors L1a and L1b, variations in the impedance of the harmonic termination circuits HT1a and HT1b are reduced.

Third Embodiment

Figure 9:
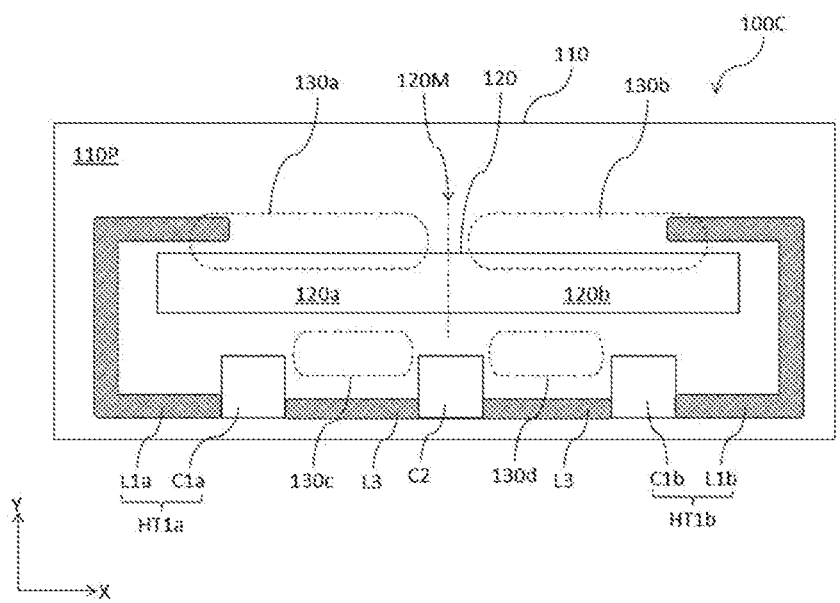
FIG. 9 is a schematic plan view of a semiconductor device according to a third embodiment of the present disclosure.

FIG. 9 is a schematic plan view of a semiconductor device 100C according to a third embodiment of the present disclosure. Configuration features of the semiconductor device 100C according to the third embodiment of the present disclosure that are different from those of the semiconductor device 100B according to the second embodiment of the present disclosure will be explained below. Explanation for configuration features of the semiconductor device 100C that are the same as those of the semiconductor device 100B will be omitted in an appropriate manner.

The semiconductor device 100C further includes a capacitor C2 (third capacitor). The capacitor C2 is formed at the semiconductor substrate 110 such that the collectors (output ends) of the transistors Q1 are connected with the inductor L3. The capacitor C2 is, for example, connected at a halfway point along the line of the inductor L3.

With the above configuration of the semiconductor device 100C, even if variations occur in the length of lines of the inductors L1a and L1b, variations in the impedance of the harmonic termination circuits HT1a and HT1b are further reduced.

Other Embodiments

A semiconductor device according to each of the embodiments described above includes two harmonic termination circuits that are arranged symmetrically with respect to a transistor region. However, the number of harmonic termination circuits included in a semiconductor device is not limited to two. One harmonic termination circuit or three or more harmonic termination circuits may be included in a semiconductor device. For example, a semiconductor device may include two or more (for example, two, three, four, or the like) pairs each including two harmonic termination circuits that are arranged symmetrically with respect to a transistor region. Furthermore, harmonic termination circuits may not be arranged symmetrically with respect to a transistor region.

Exemplary embodiments of the present disclosure have been described above. In the semiconductor device 100A, one ends of the harmonic termination circuits HT1a and HT1b are connected to the output ends of the transistors Q1, and the other ends of the harmonic termination circuits HT1a and HT1b are connected to the ground ends of the transistors Q1. Therefore, in the semiconductor device 100A, loss in output at a bump is reduced. Furthermore, in the semiconductor device 100A, there is no need to add an ESD protection element for a harmonic termination circuit.

Furthermore, the semiconductor device 100A includes the plurality of harmonic termination circuits HT1a and HT1b. Therefore, in the semiconductor device 100A, variations in the length of wires for connecting collectors of the transistors Q1 included in the transistor region 120 with the harmonic termination circuits are reduced.

Furthermore, the harmonic termination circuit HT1a and the harmonic termination circuit HT1b of the semiconductor device 100A are arranged symmetrically with respect to the transistor region 120. Therefore, in the semiconductor device 100A, variations in the length of wires for connecting the collectors of the transistors Q1 included in the transistor region 120 with the harmonic termination circuits are reduced.

Furthermore, in the semiconductor device 200A, the other ends of the harmonic termination circuits HT2a and HT2b are connected to the ground lines of the transistors Q1. Therefore, there is no need to connect the harmonic termination circuits to the module substrate by bond wires or the like, and deterioration in characteristics caused by variations in the shape of bond wires is reduced.

Furthermore, the semiconductor device 100B further includes the inductor L3 (third inductor). The inductor L3 is formed at the semiconductor substrate 110 such that a portion between the capacitor C1a and the inductor L1a that are included in the harmonic termination circuit HT1a is connected with a portion between the capacitor C1b and the inductor L1b that are included in the harmonic termination circuit HT1b. Therefore, in the semiconductor device 100B, even if variations occur in the length of lines of the inductors L1a and L1b, variations in the impedance of the harmonic termination circuits HT1a and HT1b are reduced.

Furthermore, the semiconductor device 100C further includes the capacitor C2 (third capacitor). The capacitor C2 is formed at the semiconductor substrate 110 such that the collectors (output ends) of the transistors Q1 are connected with the inductor L3. Therefore, in the semiconductor device 100C, even if variations occur in the length of lines of the inductors L1a and L1b, variations in the impedance of the harmonic termination circuits HT1a and HT1b are further reduced.

The embodiments described above are provided for easier understanding of the present disclosure and are not intended to limit the present disclosure. Components included in each embodiment and arrangements, materials, conditions, shapes, sizes, and the like of the components included in each embodiment are not limited to those illustrated in the embodiment and may be changed in an appropriate manner. Furthermore, configurations described in different embodiments may be partially replaced or combined with each other.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
   a semiconductor substrate;
   a transistor that amplifies an input signal supplied to an input end and outputs an amplified signal through an output end, the transistor being formed at the semiconductor substrate; and
   a first harmonic termination circuit configured to attenuate a harmonic component of the amplified signal, the first harmonic termination circuit being formed on the semiconductor substrate such that a first end of the first harmonic termination circuit is connected to the output end of the transistor and a second end of the first harmonic termination circuit is connected to a third end of the transistor, the third end being extended toward ground,
   wherein the transistor is a multi-finger transistor having a plurality of unit transistors, the first harmonic termination circuit being configured to attenuate a harmonic component of an amplified signal output from an output end of a first unit transistor, and being connected between the output end and a ground end of the first unit transistor,
   wherein the semiconductor device further comprises a second harmonic termination circuit configured to attenuate a harmonic component of an amplified signal output from an output end of a second unit transistor, the second harmonic termination circuit being formed on the semiconductor substrate such that a first end of the second harmonic termination circuit is connected to the output end of the second unit transistor and a second end of the second harmonic termination circuit is connected to a ground end of the second unit transistor, and wherein the first harmonic termination circuit and the second harmonic termination circuit are arranged symmetrically with respect to a region of the semiconductor substrate in which the first and second unit transistors are formed.

2. The semiconductor device according to claim 1, wherein the first harmonic termination circuit comprises a first capacitor and a first inductor that are connected in series, and wherein the second harmonic termination circuit comprises a second capacitor and a second inductor that are connected in series.

3. The semiconductor device according to claim 2, further comprising:

a third inductor that is formed on the semiconductor substrate such that a portion between the first capacitor and the first inductor is connected to a portion between the second capacitor and the second inductor via the third inductor.

4. The semiconductor device according to claim 3, further comprising:

a third capacitor that is formed on the semiconductor substrate such that the output ends of the first and second unit transistors are connected to the third inductor.

5. The semiconductor device according to claim 4, wherein the output ends of the first and second unit transistors are connected to the third inductor via the third capacitor.

6. The semiconductor device according to claim 1, wherein the first harmonic termination circuit and the second harmonic termination circuit are arranged symmetrically about a median line of the semiconductor substrate.

7. The semiconductor device according to claim 1, wherein the transistor is a heterojunction bipolar transistor.

8. The semiconductor device according to claim 2, wherein the first inductor and the second inductor are formed as a wire or wires in or on the semiconductor substrate.

* * * * *